US010033078B2

(12) United States Patent
Ciubotaru et al.

(10) Patent No.: US 10,033,078 B2
(45) Date of Patent: Jul. 24, 2018

(54) TUNABLE MAGNONIC CRYSTAL DEVICE AND FILTERING METHOD

(71) Applicants: IMEC VZW, Leuven (BE); Katholieke Universiteit Leuven, KU LEUVEN R&D, Leuven (BE)

(72) Inventors: Florin Ciubotaru, Heverlee (BE); Hanns Christoph Adelmann, Wilsele (BE); Xiao Sun, Wilsele (BE)

(73) Assignees: IMEC VZW, Leuven (BE); Katholieke Universiteit Leuven, KU LEUVEN R&D, Leuven (BE)

( * ) Notice: Subject to any disclaimer, the term of this patent is extended or adjusted under 35 U.S.C. 154(b) by 0 days.

(21) Appl. No.: 15/604,314

(22) Filed: May 24, 2017

(65) Prior Publication Data
US 2017/0346149 A1 Nov. 30, 2017

(30) Foreign Application Priority Data

May 24, 2016 (EP) ..................................... 16171126

(51) Int. Cl.
*H01P 1/20* (2006.01)
*H01P 1/218* (2006.01)
(Continued)

(52) U.S. Cl.
CPC ............. *H01P 1/218* (2013.01); *H01F 10/32* (2013.01); *H01L 43/10* (2013.01); *B82Y 10/00* (2013.01); *B82Y 25/00* (2013.01)

(58) Field of Classification Search
CPC ........... H01P 1/218; H01F 10/32; H01L 43/10
(Continued)

(56) References Cited

U.S. PATENT DOCUMENTS 8,917,152 B2 12/2014 Kondo et al.
9,602,103 B2 * 3/2017 Miura ................... G11C 11/161
(Continued)

FOREIGN PATENT DOCUMENTS

JP H10-135709 * 5/1998 ............. H01P 1/215
WO WO 2016/193552 * 12/2016 ............. H01L 43/00

OTHER PUBLICATIONS

S. Nikitov et al., Magneto-photonic and Magnonic Crystals Based on Ferrite Films—New Types of Magnetic Functional Materials, Advances in Science & Technology, Oct. 10, 2006, vol. 45, pp. 1355-1363.*

(Continued)

*Primary Examiner* — Victoria K Hall
(74) *Attorney, Agent, or Firm* — McDonnell Boehnen Hulbert & Berghoff LLP

(57) ABSTRACT

The present disclosure relates to a tunable magnonic crystal device comprising a spin wave waveguide, a magnonic crystal structure in or on the spin wave waveguide, and a magneto-electric cell operably connected to the magnonic crystal structure. The magnonic crystal structure is adapted for selectively filtering a spin wave spectral component of a spin wave propagating through the spin wave waveguide so as to provide a filtered spin wave. The magneto-electric cell comprises an electrode for receiving a control voltage, and adjusting the control voltage controls a spectral parameter of the spectral component of the spin wave via an interaction, dependent on the control voltage, between the magneto-electric cell and a magnetic property of the magnonic crystal structure.

20 Claims, 2 Drawing Sheets

(51) Int. Cl.
*H01F 10/32* (2006.01)
*H01L 43/10* (2006.01)
*B82Y 25/00* (2011.01)
*B82Y 10/00* (2011.01)

(58) Field of Classification Search
USPC .................. 333/202, 205, 207, 208, 209
See application file for complete search history.

(56) References Cited

U.S. PATENT DOCUMENTS

| | | | | |
|---|---|---|---|---|
| 2002/0063941 | A1* | 5/2002 | Matsushita | G02F 1/093 359/280 |
| 2005/0089258 | A1* | 4/2005 | Kim | G02F 1/0955 385/6 |
| 2011/0102106 | A1* | 5/2011 | Kim | H01P 1/218 333/186 |
| 2012/0280769 | A1* | 11/2012 | Kondo | H01P 1/203 333/204 |
| 2014/0119161 | A1* | 5/2014 | Tankhilevich | B06B 1/00 367/137 |
| 2015/0085569 | A1* | 3/2015 | Nozaki | H01L 29/66984 365/158 |
| 2016/0118099 | A1* | 4/2016 | Khitun | G11C 11/1673 365/158 |
| 2017/0033742 | A1* | 2/2017 | Akerman | H03B 15/006 |
| 2017/0237144 | A1* | 8/2017 | Tobar | H01P 7/06 333/232 |

OTHER PUBLICATIONS

Machine translation, Okada, Japanese Pat. Pub. No. H10-135709, translation date: Nov. 20, 2017, Espacenet, all pages.*

I. Manzhos, Resonance Excitation of Spin Waves in Ferroelectric/Ferromagnets by Oscillations of Ferroelectric Domain Walls in an Alternating Electric Field, Ferroelectrics, 1994, vol. 162, pp. 281-285.*

I. Lyubchanskii et al., Magnetic photonic crystals, J. of Physics D: Applied Physics, 2003, vol. 36, pp. R277-R287.*

J.-F. Robillard et al., Tunable magnetoelastic phononic crystals, Applied Physics Letters, Sep. 24, 2009, vol. 95, pp. 124104-1 to 124104-3.*

M. Hoefer et al., Model for a collimated spin-wave beam generated by a single-layer spin torque nanocontact, Physical Review B, Apr. 1, 2008, vol. 77, pp. 144401-1 to 144401-8.*

Written Opinion of the International Searching Authority, International Application No. PCT/FI2016/050402, dated Dec. 8, 2016, all pages.*

A. Khitun & K. Wang, Non-volatile magnonic logic circuits engineering, J. of Applied Physics, Aug. 4, 2011, Vo. 110, pp. 034306-1 to 034306-11.*

A. Khitun et al., Magnetic Cellular Nonlinear Network with Spin Wave Bus, 2010 12th International Workshop on Cellular Nanoscale Networks and their Applications (CNNA), Feb. 3-5, 2010, pp. 1-5.*

European Search Report, European Patent Application No. 16171126.2, dated Dec. 5, 2016, 8 pages.

Kim, Sang-Koog et al., "A Gigahertz-Range Spin-Wave Filter Composed of Width-Modulated Nanostrip Magnonic-Crystal Waveguides", Applied Physics Letters, vol. 95, 2009, pp. 082507-1-082507-3.

Ma, Fusheng et al., "Skyrmion-Based Dynamic Magnonic Crystal", Nano Letters, vol. 15, No. 6, Abstract, 2 pages.

Ma, Fusheng et al., "Skyrmion-Based Dynamic Magnonic Crystal", Nano Letters, vol. 15, No. 6, pp. 4029-4036 and S1-S13.

Di, K. et al., "Tuning the Band Structures of a 1D Width-Modulated Magnonic Crystal by a Transverse Magnetic Field", Journal of Applied Physics, vol. 115, No. 5, 2014, pp. 1-7.

Khitun, Alexander et al. "Magnetic Cellular Nonlinear Network With Spin Wave Bus for Image Processing", Superlattices and Microstructures, vol. 47, No. 3, Mar. 1, 2010, pp. 464-483.

Khitun, Alexander et al., "Non-Volatile Magnonic Logic Circuits Engineering", Journal of Applied Physics, vol. 110, No. 3, Aug. 1, 2011, pp. 34306-1-34306-11.

Khitun, Alexander et al., "Magnetic Cellular Nonlinear Network With Spin Wave Bus", 2010 12th International Workshop on Cellular Nanoscale Networks and Their Applications, Feb. 3, 2010, pp. 1-5.

Kumar, N. et al., "Spin Wave Dispersion in Striped Magnonic Waveguide", IEEE Transactions on Magnetics, vol. 49, No. 3, Mar. 3, 2013, pp. 1024-1028.

* cited by examiner

TUNABLE MAGNONIC CRYSTAL DEVICE AND FILTERING METHOD

CROSS-REFERENCE TO RELATED APPLICATION

The present application is a non-provisional patent application claiming priority to European Patent Application No. 16171126.2 filed May 24, 2016, the contents of which are hereby incorporated by reference.

TECHNICAL FIELD

The disclosure relates to the field of magnonics, e.g., the field of solid state physics in which the properties of spin waves in nano-structure elements are applied. More specifically it relates to a tunable magnonic crystal, systems comprising such a tunable magnonic crystal, and related methods.

BACKGROUND

In magnonic devices, wave properties and magnetism are combined on a nano-scale, e.g., spin waves (also referred to as magnons) are formed and applied in such devices. Spin waves may be considered as states of magnetization that propagate as a wave in a suitable material, e.g., a ferromagnetic material shaped and isolated so as to form a magnetic spin wave waveguide element.

A magnonic crystal, as known in the art, is a component formed by a medium allowing spin wave transmission, in which a lattice is formed by periodic modulation of material properties of the medium and/or of the geometry. The modulation length of such a lattice may, for example, be of the order of the wavelength of the transmitted spin waves. For example, a magnonic crystal may comprise a material or materials configured such that a periodic modulation of magnetic parameters is achieved, e.g., by directly engineering the material composition or by modulating a geometric configuration of the material. The spin wave transmission spectrum of such artificial lattices may typically comprise band gaps, e.g., frequency ranges in which propagation of the spin wave is suppressed, inhibited, or prohibited. For example, the periodic modulation of magnetic parameters in a magnonic crystal may give rise to artificially configured band structures, thus providing good control over the spin wave transmission spectrum.

An example of a magnonic crystal may comprise a one-dimensional diffraction grating created in a ferromagnetic waveguide for spin waves. For example, such a waveguide may be formed by a strip of ferromagnetic material. The grating may modulate the internal magnetic field periodically in the direction of propagation along the waveguide structure to achieve a predetermined band structure.

The periodic nature of such a lattice may be conventionally predetermined when the device is manufactured. However, it may be advantageous for various applications to provide a magnonic crystal having tunable transmission spectra, e.g., in which the band gap structure may be adjusted during operation of the device.

The present disclosure relates particularly to tunable magnonic crystals and their applications. This tunability should be interpreted as not only allowing a configuration of the spectral band structure by careful design and manufacture of the device, but allowing a reconfiguration of the spectral properties, e.g., the pass band frequencies, during operation of the device. Thus, band structures in such a tunable magnonic crystal device may be advantageously reprogrammed during operation. Unlike for similar periodic artificial structures for manipulating the flow of plasmons, elastic waves, or acoustic waves, magnonic crystals have a band structure that not only depends on a periodic patterning of the structure, but is strongly dependent on a spatial configuration of magnetization vectors in the crystal.

One possible application of a tunable magnonic crystal could be in radio frequency (RF) filters. Conventional RF filters are widely used in mobile phones, Bluetooth, satellite navigation and communication, and wireless local area networks (WLAN). For example, the number of RF filters used in a single mobile phone may range from three to seven filters. However, integrated on-chip solutions for RF filters are currently mainly based on LC circuits. Further, conventional solutions may use surface-mounted standalone devices, such as SAW or BAW filters. However, integrated, as well as standalone, devices are relatively large with respect to typical integrated circuits. The size of these devices is typically of the order of a square millimeter, while integrated LC filters are typically limited by the inductor size, which may be of the order of at least $10^4$ $\mu m^2$ per inductor. SAW and BAW filters are furthermore difficult to integrate on-chip, and difficult to scale without increased losses. SAW filters are moreover limited in performance and maximum frequency. Thus, it may be advantageous to replace such RF filter components by an on-chip integrated component of small size. Such integrated component may also have a small size while providing a good performance and a large frequency range. Such a filter may also be tunable, e.g., to be able to compensate for passband drift.

SUMMARY OF THE DISCLOSURE

It is an object of embodiments of the present disclosure to provide means and methods for filtering signals, e.g., for filtering spin wave signals.

The above objective may be accomplished by methods and devices according to the present disclosure.

In some embodiments of the present disclosure, a small footprint device can be achieved for filtering signals, e.g., radiofrequency signals, e.g., signals in the gigahertz (GHz) range. For example, a microwave RF filter can be implemented that is considerably smaller than a conventional LC, SAW, and/or BAW filter.

In some embodiments of the present disclosure, integration can be achieved on a semiconductor chip, e.g., in a back-end-of-line CMOS-compatible process.

In some embodiments of the present disclosure, high signal frequencies, e.g., higher than 1 GHz, higher than 10 GHz, or even 60 GHz and higher, can be efficiently filtered.

In some embodiments of the present disclosure, a good filter quality factor (Q factor) can be achieved, e.g., comparable to or better than those obtained for conventional LC filters.

In some embodiments of the present disclosure, a selectivity of at least 20 dB and a quality factor of at least 20 can be achieved.

In some embodiments of the present disclosure, a filter is provided that has good design scalability, e.g., for system-on-chip application.

In a first aspect, embodiments of the present disclosure relate to a tunable magnonic crystal device comprising a spin wave waveguide. The device further comprises a magnonic crystal structure provided, or arranged, in, and/or on, the spin wave waveguide. The magnonic crystal structure may be adapted for selectively filtering a spin wave spectral component of a spin wave propagating through the spin wave waveguide so as to provide a filtered spin wave. The device also comprises a magneto-electric cell operably connected to the magnonic crystal structure. The magneto-electric cell comprises an electrode element for receiving a control voltage to select a spectral parameter of the spectral component of the spin wave (e.g., a spectral parameter such as a bandwidth, a filter peak frequency, a phase shift, a notch frequency, and/or another controllable spectral parameter) via an interaction, dependent on the control voltage, between the magneto-electric cell and a magnetic property of the magnonic crystal structure, e.g., a magnetic anisotropy or magnetization property.

In some embodiments of the present disclosure, the magneto-electric cell may comprise a magnetostrictive layer and a piezoelectric layer. For example, the magnetostrictive layer may be provided on the magnonic crystal structure, and a piezoelectric layer may be provided on the magnetostrictive layer.

In some embodiments of the present disclosure, the magnetic property of the magnonic crystal structure may be affected by a magnetization of the magnetostrictive layer, and the magnetization of the magnetostrictive layer may be affected by a piezoelectrically generated mechanical stress induced by the control voltage.

In some embodiments of the present disclosure, the spin wave waveguide may comprise an elongate ferromagnetic or ferrite material strip on a substrate.

In some embodiments of the present disclosure, the spin wave waveguide may be adapted for conducting the spin wave, in which the spin wave comprises at least a microwave frequency spectral component.

In some embodiments of the present disclosure, the magnonic crystal structure may comprise a periodic structure formed by a periodic spatial variation of magnetic and/or geometrical properties.

In some embodiments of the present disclosure, the periodic spatial variation may comprise a periodic variation of saturation magnetization, damping, magnetocrystalline anisotropy, and/or shape of the magnonic crystal structure.

In some embodiments of the present disclosure, the tunable magnonic crystal device may further comprise an input transducer for converting an input signal into the spin wave having the same or substantially the same spectrum as the input signal, and/or may comprise an output transducer for converting the filtered spin wave into an output signal having the same or substantially the same spectrum as the filtered spin wave.

In some embodiments of the present disclosure, the input transducer and/or the output transducer may comprise a magneto-electric transducer and/or a co-planar waveguide antenna.

In some embodiments of the present disclosure, the tunable magnonic crystal device may further comprise a spin wave amplifier in or on the spin wave waveguide for amplifying the filtered spin wave to form an amplified filtered spin wave. This spin wave amplifier may be integrated in the magnetoelectric cell, or may comprise a separate component.

In some embodiments of the present disclosure, the spin wave amplifier may comprise a further magneto-electric cell and/or a structure for generating a spin transfer torque and/or a spin orbit torque on the spin wave waveguide.

In some embodiments of the present disclosure, the spin wave amplifier may comprise a magnetic tunnel junction.

In some embodiments of the present disclosure, the tunable magnonic crystal device may further comprise an output transducer for converting the filtered spin wave into an output signal having substantially the same spectrum as the filtered spin wave and an electrical signal amplifier connected to the output transducer for amplifying the output signal in the electrical domain.

In some embodiments of the present disclosure, the electrical signal amplifier may comprise a sense amplifier integrated in a semiconductor substrate underneath the spin wave waveguide and/or the magnonic crystal structure.

In a second aspect, embodiments of the present disclosure also relate to a method for selectively filtering a spectral component of a signal. This method comprises providing the signal in the form of a spin wave. The method further comprises applying a control voltage to a magneto-electric cell operably connected to a magnonic crystal structure to select a spectral parameter of the spectral component of the spin wave via an interaction, dependent on the control voltage, between the magneto-electric cell and a magnetic property of the magnonic crystal structure.

The method also comprises transmitting the spin wave through the magnonic crystal structure to generate a filtered spin wave by selectively filtering the spin wave spectral component of the spin wave in accordance with the selected spectral parameter.

In some embodiments of the present disclosure, the providing of the signal may comprise receiving a radio frequency electric or electromagnetic input signal and converting the input signal into the spin wave, such that the spin wave has substantially the same spectrum as the input signal.

In some embodiments of the present disclosure, the method may further comprise converting the filtered spin wave into an electric or electromagnetic output signal, such that the output signal has substantially the same spectrum as the filtered spin wave.

Particular aspects of the disclosure are set out in the accompanying independent and dependent claims. Features from the dependent claims may be combined with features of the independent claims and with features of other dependent claims as appropriate and not merely as explicitly set out in the claims.

These and other aspects of the disclosure will be apparent from and elucidated with reference to the embodiment(s) described hereinafter.

DETAILED DESCRIPTION

Figure 1:
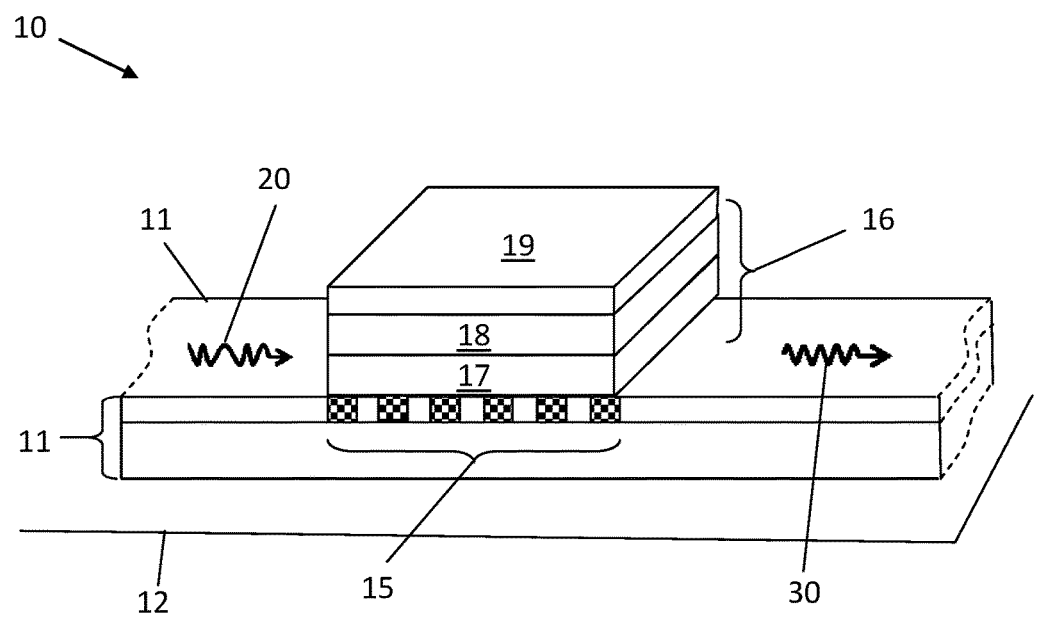
FIG. 1 illustrates a tunable magnonic crystal device, according to an example embodiment.

The present disclosure will be described with respect to particular embodiments and with reference to certain drawings, but the disclosure is not limited thereto but only by the claims. The drawings described are only schematic and are non-limiting. In the drawings, the size of some of the elements may be exaggerated and not drawn on scale for illustrative purposes. The dimensions and the relative dimensions do not correspond to actual reductions to practice of the disclosure.

Further, the terms first, second, and the like in the description and in the claims, are used for distinguishing between similar elements and not necessarily for describing a sequence, either temporally, spatially, in ranking, or in any other manner. It is to be understood that the terms so used are interchangeable under appropriate circumstances and that the embodiments of the disclosure described herein are capable of operation in other sequences than described or illustrated herein.

Moreover, the terms top, under, and the like in the description and the claims are used for descriptive purposes and not necessarily for describing relative positions. It is to be understood that the terms so used are interchangeable under appropriate circumstances and that the embodiments of the disclosure described herein are capable of operation in other orientations than described or illustrated herein.

It is to be noticed that the term "comprising", used in the claims, need not be interpreted as being restricted to the components listed thereafter; it need not exclude other elements or steps. It is thus to be interpreted as specifying the presence of the stated features, integers, steps or components as referred to, but need not preclude the presence or addition of one or more other features, integers, steps or components, or groups thereof. Thus, the scope of the expression "a device comprising components A and B" need not be limited to devices consisting only of components A and B.

Reference throughout this specification to "one embodiment" or "an embodiment" means that a particular feature, structure, or characteristic described in connection with the embodiment is included in at least one embodiment of the present disclosure. Thus, appearances of the phrases "in one embodiment" or "in an embodiment" in various places throughout this specification are not necessarily all referring to the same embodiment, but may. Further, the particular features, structures, or characteristics may be combined in any suitable manner, as would be apparent to one of ordinary skill in the art from this disclosure, in one or more embodiments.

Similarly, it should be appreciated that in the description of example embodiments of the disclosure, various features of the disclosure are sometimes grouped together in a single embodiment, figure, or description thereof for the purpose of streamlining the disclosure and aiding in the understanding of one or more of the various described aspects. This method of disclosure, however, is not to be interpreted as reflecting an intention that the claimed disclosure requires more features than are expressly recited in each claim. Rather, as the following claims reflect, certain aspects lie in less than all features of a single foregoing disclosed embodiment. Thus, the claims following the detailed description are hereby expressly incorporated into this detailed description, with each claim standing on its own as a separate embodiment of this disclosure.

Further, while some embodiments described herein include some but not other features included in other embodiments, combinations of features of different embodiments are meant to be within the scope of the disclosure, and form different embodiments, as would be understood by those in the art. For example, in the following claims, any of the claimed embodiments can be used in any combination.

In the description provided herein, numerous specific details are set forth. However, it is to be understood that embodiments of the disclosure may be practiced without these specific details. In other instances, well-known methods, structures, and techniques have not been shown in detail in order not to obscure an understanding of this description.

In a first aspect, embodiments of the present disclosure relate to a tunable magnonic crystal device. Such a tunable magnonic crystal device may be adapted for selecting, e.g., filtering, at least one spin wave frequency component having a configurable, e.g., tunable and/or programmable, frequency. The tunable magnonic crystal device comprises a spin wave waveguide, a magnonic crystal structure provided in or on the spin wave waveguide, and a magneto-electric cell operably connected to the magnonic crystal structure. The magnonic crystal structure may be adapted, e.g., configured, for selectively filtering at least one spin wave spectral component of a spin wave propagating through the spin wave waveguide, such as to provide a filtered spin wave.

The magneto-electric cell may comprise an electrode element for receiving a control voltage to select a spectral parameter of the spectral component of the spin wave 20. For example, the magneto-electric cell may comprise a pair of complementary electrode elements for receiving the control voltage as an electric potential difference over the complementary electrode elements. The spectral parameter, e.g., a frequency shift, phase, or bandwidth parameter, may be selected via an interaction, e.g., due to an interaction, between the magneto-electric cell and a magnetic property of the magnonic crystal structure, e.g., a magnetic property such as a magnetocrystalline anisotropy or a magnetization of the magnonic crystal structure. This interaction between the magneto-electric cell and the magnetic property of the magnonic crystal structure may depend on the control voltage, e.g., so as to allow the configuration of the spectral parameter by applying a suitable control voltage.

The magneto-electric cell may comprise a magnetostrictive layer provided on the magnonic crystal structure, e.g., in proximity to or in direct physical contact with the magnonic crystal structure so as to allow an interaction of magnetization states of the magnetostrictive layer with the magnonic crystal structure. The magneto-electric cell may also comprise a piezoelectric layer provided on the magnetostrictive layer, e.g., in proximity to or in direct physical contact with the magnetostrictive layer, e.g., spaced away from the magnonic crystal structure by the magnetostrictive layer. The electrode element, e.g., the pair of complementary electrode elements, may be arranged in physical contact with or in close proximity to the piezoelectric layer, so as to form an electric field in the piezoelectric layer when the control voltage is applied. The electrode element may thus be provided on the piezoelectric layer, e.g., in proximity to or in direct physical contact with the piezoelectric layer, e.g., spaced away from the magnetostrictive layer by the piezoelectric layer. The magnetic property of the magnonic crystal structure, referred to hereinabove, may be affected by a magnetization of the magnetostrictive layer, and the magnetization of the magnetostrictive layer may be affected by a piezoelectrically generated mechanical stress induced by the control voltage.

Thus, the magneto-electric cell may be configured to produce, e.g., adapted for producing, a mechanical stress in the piezoelectric layer when a control voltage is applied to the electrode element. The magneto-electric cell may be further adapted for allowing this mechanical stress to affect a magnetization of the magnetostrictive layer so as to induce a spectral change of the selectively filtered spin wave spectral component.

Referring to FIG. 1, an example tunable magnonic crystal device 10 in accordance with embodiments of the present disclosure is shown.

This tunable magnonic crystal device 10 may be adapted for selecting, e.g., filtering, at least one spin wave frequency component having a configurable, e.g., tunable and/or programmable, frequency. For example, the spin wave frequency component may correspond to a pass band or stop band structure. However, embodiments of the present disclosure are not limited thereto, e.g., the magnonic crystal device 10 may be adapted for implementing a more complex filter function, e.g., a notch filter.

The tunable magnonic crystal device 10 comprises a spin wave waveguide 11, e.g., a spin wave bus. This spin wave waveguide 11 may comprise a ferromagnetic strip, e.g., an elongate ferromagnetic strip. However, embodiments of the present disclosure are not necessarily limited to ferromagnetic spin wave buses, e.g., the spin wave waveguide may comprise any material having magnetic properties suitable for the propagation of spin waves, e.g., magnons. For example, the spin wave waveguide 11 may comprise an antiferromagnetic material.

The spin wave waveguide 11 may comprise a ferromagnetic material, such as ferromagnetic materials based on iron, copper, nickel, or alloys thereof, or heterostructures formed from such materials, e.g., NiFe, CoFe, CoNi, CoFeB, or CoPt. The spin wave waveguide 11 may comprise a ferrite material, e.g., oxides based on Fe, Ba, Y, Sr, Zn, and/or Co.

The spin wave waveguide 11 may be elongate, having a major longitudinal dimension and a minor transverse dimension in a plane parallel to a substrate 12. For example, the minor transverse dimension may be relatively small so as to allow propagation of spin waves through the spin wave waveguide 11 along substantially only one directional axis, e.g., corresponding to the longitudinal dimension.

The spin wave waveguide 11 may be adapted for conducting spin wave signals having microwave frequencies, e.g., in the gigahertz range, e.g., higher than or about equal to 1 GHz, higher than or equal to 10 GHz, higher than or equal to 20 GHz, higher than or equal to 40 GHz, or even 60 GHz or higher. In some embodiments of the present disclosure the tunable magnetic crystal device 10 can be implemented on a nanoscale, e.g., having physical dimensions smaller than the wavelength in free space of an electromagnetic wave in the microwave spectrum, yet can be effectively used to process signals at such high frequencies. Further, high processing rates and high signal frequencies can be combined with a small footprint.

The spin wave waveguide 11 may be provided on the substrate 12. For example, the substrate 12 may be a semiconductor substrate, e.g., the tunable magnonic crystal device 10 may be manufactured using CMOS compatible processing technology.

The spin wave waveguide 11 may comprise a film, e.g., a ferromagnetic film, a wire, or a strip. The spin wave waveguide 11 may comprise a ferromagnetic, antiferromagnetic, or ferrite material. In some examples, the material or materials forming the spin wave waveguide 11 may be compatible with semiconductor processing technology, e.g., silicon technology.

The spin wave waveguide 11 may, for example, be an elongate spin wave waveguide having a width, e.g., in a direction orthogonal to a longitudinal orientation of the waveguide and parallel to the substrate 12, that is less than or equal to 2 µm, less than or equal to 1 µm, or less than or equal to 750 nm, e.g., in the range of 350 nm to 650 nm, e.g., 500 nm. The elongate spin wave waveguide 11 may further have a length, e.g., in the longitudinal direction, greater than or equal to 5 µm, or greater than or equal to 7.5 µm, e.g., in the range of 8 µm to 30 µm, in the range of 9 µm to 20 µm, or in the range of 10 µm to 15 µm.

The tunable magnonic crystal device 10 further comprises a magnonic crystal structure 15 provided in or on the spin wave waveguide 11. The magnonic crystal structure 15 is adapted, e.g., configured, for selectively filtering at least one spin wave spectral component of a spin wave 20 propagating through the spin wave waveguide 11. Thus, a filtered spin wave 30 is provided by the magnonic crystal structure 15 during operation. For example, the magnonic crystal structure 15 may have a length, e.g., in a longitudinal direction of the elongate spin wave waveguide 11, in the range of 100 nm to 100 µm, 500 nm to 75 µm, 1 µm to 50 µm, 2 µm to 20 µm, 3 µm to 10 µm, or 4 µm to 7 µm, e.g., 5 µm.

The magnonic crystal structure 15 may comprise a periodic structure. The magnonic crystal structure 15 may thus comprise a structure, e.g., a ferromagnetic or antiferromagnetic structure, having an artificial periodic spatial variation of magnetic and/or geometrical properties, such as saturation magnetization, damping, magnetocrystalline anisotropy, and/or shape. Spin waves may propagate through the magnonic crystal structure, e.g., received at an input region from the waveguide 11 and transmitted through the magnonic crystal structure 15 to an output region where it is provided in a filtered state, e.g., a filtered spin wave 30, to the waveguide 11. The magnonic crystal structure 15 may be formed in or on a part of the spin wave waveguide 11, e.g., an input section of the waveguide 11 may connect to the magnonic crystal structure 15, and the magnonic crystal structure 15 may be further connected to an output section of the waveguide 11. The magnonic crystal structure 15 may also be formed in or on substantially the entire spin wave waveguide 11, e.g., the magnonic crystal structure 15 may cover the entire waveguide 11. For example, the magnonic crystal structure 15 may extend from an input of the waveguide 11 to an output of the waveguide 11, e.g., such that the spin wave propagates substantially exclusively through the magnonic crystal structure 15.

When propagating through the magnonic crystal structure 15, spin waves having wavelengths that fulfill a functional relation to the spatial periodicity of the magnonic crystal, e.g., spin waves having a wavelength equal to an integer number of spatial periods, may be reflected by the magnonic crystal structure 15. Thus, a continuous spin wave spectrum may be divided into regions of stop bands, e.g., frequency intervals over which the spin waves are not propagating, and pass bands, e.g., frequency intervals over which the spin waves are transmitted. By designing the amplitude and the spatial distribution of the modulated magnetic and/or geometrical property or properties, the number of the pass bands and stop bands and their characteristics can be varied. However, this relation can also be controlled during operation in a device in accordance with embodiments of the present disclosure, as will be discussed hereinbelow in detail.

The periodic structure may comprise a periodic geometrical patterning and/or a symmetric lattice of spatially varying magnetic material properties. For example, the magnonic crystal structure 15 may comprise a periodic distribution of different material compositions or material parameters, e.g., so as to obtain a periodic variation in saturation magnetization. For example, a segment of the spin wave waveguide 11 may have a periodic variation of saturation magnetization to form the magnonic crystal structure 15 obtained, for example, by ion implantation. The magnonic crystal structure 15 may comprise, additionally or alternatively, periodic heterostructures of different materials, e.g., different magnetic materials. The magnonic crystal structure 15 may comprise a periodic array of islands, e.g., isolated or on top of a ferromagnetic film, in which these islands may be composed of the same magnetic material as the ferromagnetic film or another deposited material. These islands may thus form a periodic arrangement of pillar structures provided on the waveguide 11. The magnonic crystal structure 15 may comprise a periodic array of cavities in the waveguide 11, e.g., cavities filled with a different magnetic material or a periodic array of holes in a film.

Alternatively, or additionally, the magnonic crystal structure 15 may comprise a periodic modulation of a width and/or a height of the spin wave waveguide 11, in which this width and height are both orthogonal to a principal direction of propagation of spin waves through the spin wave waveguide 11 during operation of the device, e.g., orthogonal to the longitudinal axis of the elongate spin wave waveguide 11.

Figure 3:
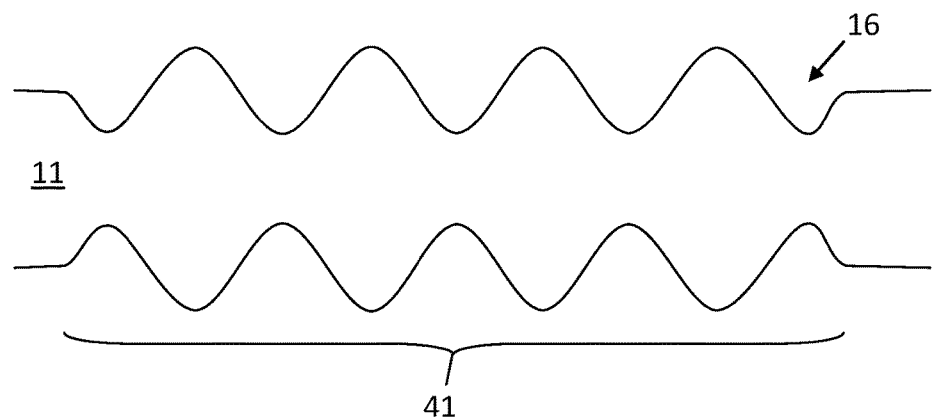
FIG. 3 shows a first example geometric design of a magnonic crystal structure for use in a tunable magnonic crystal device, according to an example embodiment.
Figure 4:
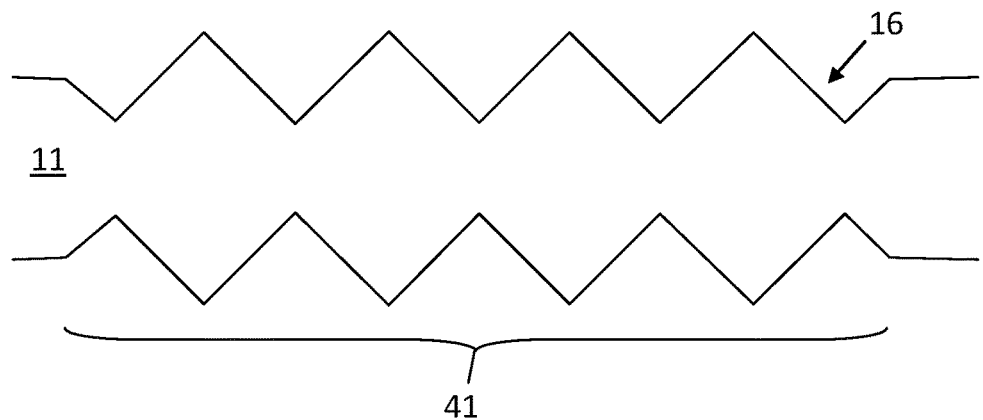
FIG. 4 shows a second example geometric design of a magnonic crystal structure for use in a tunable magnonic crystal device, according to an example embodiment.
Figure 5:
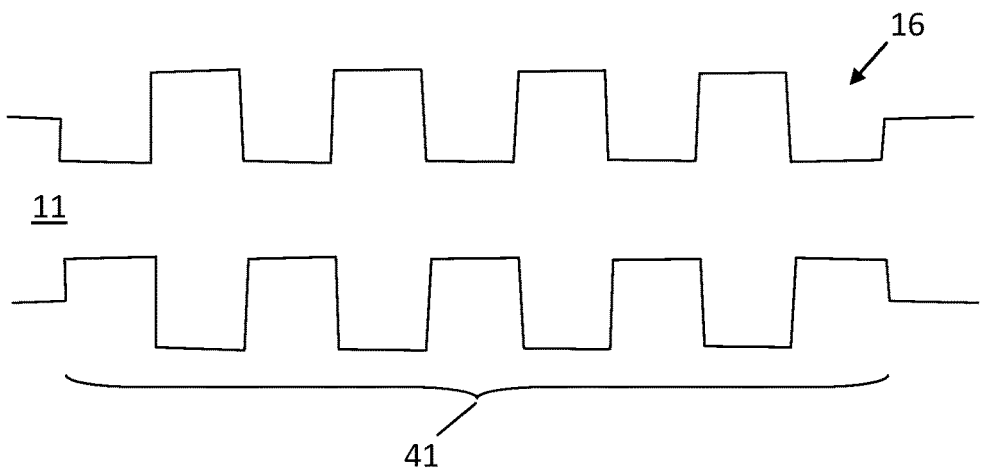
FIG. 5 shows a third example geometric design of a magnonic crystal structure for use in a tunable magnonic crystal device, according to an example embodiment.

For example, the magnonic crystal structure 15 may comprise a shape-modulated segment 41 of the spin wave waveguide 11, e.g., having a periodic modulation of width and/or thickness, e.g., as illustrated in FIG. 3, FIG. 4 and FIG. 5. This shape modulated segment 41 may, for example, have a sinusoidal width profile as shown in FIG. 3, a corrugated profile, e.g., a sawtooth profile, as shown in FIG. 4, or a step-function profile, as shown in FIG. 5. Other examples are possible as well.

As such, the magnonic crystal structure 15 may allow for spectral filtering properties, such as frequency and phase, to be controlled by external magnetic fields during operation of the device. However, the spectral filtering properties of the magnonic crystal structure 15 may also be controlled by other influences on the magnetic material properties of the magnonic crystal structure 15, by influencing the magnetocrystalline anisotropy. In some embodiments of the present disclosure, the spectral filtering properties of the magnonic crystal structure 15 can be controlled during operation by interaction with a magneto-electric cell as discussed further hereinbelow. Thus, inductively generated magnetic fields, e.g., by a current-conducting wire, and/or bulky, repositionable arranged ferromagnets, need not be required for exerting control over the spectral filtering properties of the magnonic crystal structure 15. Therefore, a small footprint, reliability, robustness, and low power consumption may be achieved as compared to such inductive control or control by applying an external field using permanent magnets.

The tunable magnonic crystal device 10 also comprises a magneto-electric cell 16 operably connected to the magnonic crystal structure 15, e.g., so as to allow a control of the spectral component by application of an electric field, as detailed further hereinbelow.

The magneto-electric cell 16 comprises an electrode element 19 for receiving a control voltage to select a spectral parameter of the spectral component of the spin wave 20 by an interaction, e.g., due to this interaction, between the magneto-electric cell 16 and a magnetic property of the magnonic crystal structure 15, e.g., a magnetocrystalline anisotropy or a magnetization of the magnonic crystal structure 15. This interaction is dependent on the control voltage, e.g., so as to allow the configuration of the spectral parameter by applying a suitable control voltage.

The control voltage may correspond to an electric potential difference over a pair of electrodes, e.g., the electrode element 19 and a counter-electrode, e.g., a ground electrode, such that this electric potential difference is applied over at least a part of the magneto-electric cell 16.

The magneto-electric cell 16 may include an element adapted for using the magneto-electric effect for inducing magnetic polarization by applying an external electric field, e.g., by application of the control voltage. The magneto-electric cell 16 may be characterized by non-zero linear and/or nonlinear magneto-electric susceptibilities.

The magneto-electric cell 16 may comprise a single phase magneto-electric material, such as $Cr_2O_3$. The magneto-electric cell 16 may comprise a multiferroic material, e.g., exhibiting an intrinsic coupling between the magnetic and electric order parameters of the multiferroic material.

The magneto-electric cell 16 may comprise a magneto-electric junction for exerting a voltage dependent magnetic anisotropy effect on the magnonic crystal structure 15. For example, a dielectric layer may space a ferromagnetic material of the magnonic crystal structure 15, e.g. forming part of the spin wave waveguide 11, apart from a further ferromagnetic layer. Such a magnetoelectric junction may be adapted for altering the magnetic anisotropy of the ferromagnetic material of the magnonic crystal structure 15 when the control voltage is applied over the magnetoelectric junction, e.g., over the dielectric layer. For example, the magnetocrystalline anisotropy of the magnonic crystal structure 15 may be affected by interface properties between the ferromagnetic materials and the dielectric layer, and controlled by the control voltage applied across the dielectric layer.

The magneto-electric cell 16 may comprise a combination of at least one magnetostrictive and at least one piezoelectric material, in which piezoelectrically induced strains at a tightly bonded interface between these materials provides a coupling between the applied electric field and the induced magnetic properties.

For example, the magneto-electric cell 16 may comprise a ferroelectric-ferromagnetic heterostructure, in which a strain-induced magneto-electric interaction occurs in response to the control voltage, e.g., such that a uniaxial magnetic anisotropy can be controlled by the control voltage.

For example, the magneto-electric cell 16 may comprise a magnetostrictive layer 17 provided on the magnonic crystal structure 15, e.g., in proximity to or in direct physical contact with the magnonic crystal structure 15. This proximity or contact may enable an interaction of magnetization states of the magnetostrictive layer 17 with the magnonic crystal structure 15.

The magneto-electric cell 16 may also comprise a piezoelectric layer 18 provided on the magnetostrictive layer 17, e.g., in proximity to or in direct physical contact with the magnetostrictive layer 17, e.g., spaced away from the magnonic crystal structure 15 by the magnetostrictive layer 17.

However, the magneto-electric cell 16 may also comprise such layers in another order. For example, the piezoelectric layer 18 may be arranged on the magnonic crystal structure 15, e.g., in proximity to or in direct physical contact with the magnonic crystal structure 15, and the magnetostrictive layer 17 may be arranged on the piezoelectric layer 18, e.g., in proximity to or in direct physical contact with the piezoelectric layer 18, e.g., such that the magnetostrictive layer 17 is spaced away from the magnonic crystal structure 15 by the piezoelectric layer 18. Likewise, while an electrode layer, e.g., the electrode element 19, may be provided on top of the stack, embodiments are not limited thereto. For example, electrode elements may be integrated in the piezoelectric layer 18 to allow the application of an electric field over the piezoelectric layer 18 such that the field is oriented substantially in-plane with respect to the piezoelectric layer 18 orientation. Alternatively, electrode elements may be integrated above and below the piezoelectric layer 18, such that an electric field may be applied over the piezoelectric layer 18 that is oriented substantially normal to the piezoelectric layer 18.

For example, molecular beam epitaxy, or another suitable technique for manufacturing magneto-electric composite material cells, may be applied for depositing the piezoelectric layer 18 and magnetostrictive layer 17.

Further, in some embodiments of the magneto-electric cell 16, a plurality of piezoelectric layers 18 and a plurality of magnetostrictive layers 17 may be stacked, e.g., so as to alternate the piezoelectric layers 18 and magnetostrictive layers 17 in a combined stack.

The electrode element 19, e.g., a pair of complementary electrode elements, may be arranged in physical contact with, or at least in close proximity to, the piezoelectric layer 18, so as to form an electric field in the piezoelectric layer 18 when the control voltage is applied to the electrode element 19. The electrode element 19 may, for example, be provided on the piezoelectric layer 18, e.g., in proximity to or in direct physical contact with the piezoelectric layer 18, e.g., spaced away from the magnetostrictive layer 17 by the piezoelectric layer 18.

The magneto-electric cell 16 may be configured to produce, e.g., adapted for producing, a mechanical stress in the piezoelectric layer 18 when the control voltage is applied to the electrode element 19. For example, the tunable magnonic crystal device 10 may comprise a counter-electrode (not shown), e.g., underneath the substrate 12, on the substrate 12, or in the substrate 12, for providing a reference voltage, such that a piezoelectrical stress-inducing electric field can be generated over the piezoelectric layer 18 by applying a voltage potential, e.g., a voltage potential formed by a difference between the control voltage and the reference voltage, e.g., a voltage potential over the electrode 19 and the counter-electrode.

The magneto-electric cell 16 may be further adapted for allowing this mechanical stress, e.g., at an interface of the piezoelectric layer 18, to affect a magnetization or magnetocrystalline anisotropy of the magnetostrictive layer 17 so as to induce a spectral change of the selectively filtered spin wave spectral component. Thus, a magnetic property of the magnonic crystal structure 15, may be affected, e.g., determined, by a magnetization of the magnetostrictive layer 17, where the magnetization of the magnetostrictive layer 17 may be affected by a piezoelectrically generated mechanical stress induced by the control voltage.

For example, eigenfrequencies of the spectral component or components may be shifted up and/or down by applying a suitable control voltage. For example, by altering a magnetic property of the magnonic crystal structure 15, e.g., the magnetocrystalline anisotropy, a pass band wavelength of the magnonic crystal 15 may be dynamically adjusted.

The magneto-electric cell 16 may be a resonant or non-resonant magneto-electric cell. For example, the magnetostrictive layer 17 and the piezoelectric layer 18 may be connected such that a change in physical dimensions of the piezoelectric material of the piezoelectric layer 18 results in a mechanical stress in the magnetostrictive layer 17, e.g., thus resulting in a change in magnetization of the magnetostrictive layer 17 having an effect on the magnonic crystal properties. However, the magneto-electric cell 16 may comprise a resonant magneto-electric cell, for example comprising an acoustic isolation around the magnetostrictive layer 17 and piezoelectric layer 18 to form an acoustic resonator. For example, such an acoustic isolation may comprise at least one acoustic mirror formed on opposite sides of the magneto-electric cell 16 so as to embed the magneto-electric cell 16 in an acoustic cavity. For example, at least one air gap and/or acoustic Bragg mirror may be arranged to cover at least two opposite sides of the magneto-electric cell 16, e.g., in order to form such an acoustic cavity.

The control voltage may be applied as an AC or DC signal, e.g., a continuous, alternating or pulsed signal. For example, a magneto-electric cell of the resonant type may be operated in an alternating current mode to generate an acoustic resonance effect in the magneto-electric cell. The structure and operation of such a resonant magneto-electric cell may be known to a person skilled in the art. An advantage of such a resonant magneto-electric cell, operated in a suitable AC signal mode, in accordance with embodiments of the present disclosure, is that a large strain can be generated, and thus a strong magneto-electric coupling can be achieved. However, as will be described hereinbelow, a nonresonant magneto-electric cell may be operated in an AC or a DC mode, or a combination thereof, and, likewise, a resonant magneto-electric cell may be operated in an AC or a DC mode, or a combination thereof. Further, while operation of a resonant magneto-electric cell at an AC control voltage frequency that induces acoustic resonance in the structure may be advantageous, the operation of such a device is not limited to such resonance frequencies. For example, a resonant magneto-electric cell may be tuned for acoustic resonance at a default mode, e.g., a commonly selected mode during normal operation, yet may allow a deviation from this default mode in order to tune the filtering operation to a less commonly selected setting.

The impact of DC control voltages, respective to AC control voltages, on the spectrum of the magnonic crystal structure may be different.

In accordance with embodiments of the present disclosure, a mechanical strain may be generated by applying the control voltage to the magneto-electric cell 16. This electrical-mechanical coupling may be rapid, e.g., may take place on a time scale substantially shorter than a time scale corresponding to typical spin wave frequencies. For example, a strain may be generated substantially instantaneously in response to the applied control voltage, e.g., almost instantaneous insofar relevant for the intended effect on the filtering of spin waves. Thus, magnetic anisotropy may be varied in phase with the applied control voltage, e.g., the applied electric field, even for alternating current (AC) excitations in the gigahertz (GHz) range.

A direct current (DC) voltage, or a DC voltage component superimposed on a time-varying signal, may introduce a static magnetic field. Such a static magnetic field may shift the resonance frequency of the magnonic crystal structure 15 by changing the dispersion relation of the magnons, thus achieving a tunable filtering function.

On the other hand, an alternating current (AC) control voltage, or such an AC component superimposed on a constant DC signal component, may change the resonance frequency in an oscillatory way. This may thus be used for spin wave parametric amplification, by selecting the frequency appropriately. For example, spin wave damping may thus be countered in accordance with embodiments of the present disclosure.

For example, where reference is made further hereinbelow to the tunable magnonic crystal device 10 comprising a spin wave amplifier 23 integrated in or on the spin wave waveguide 11, the spin wave amplifier 23 may be adapted for amplifying the filtered spin wave 30 to form an amplified filtered spin wave 40. For example, the magnetoelectric cell 16 may be adapted for receiving a control voltage that has a first component, e.g., a DC voltage component, for controlling at least one property of the magnonic crystal structure 15, and a second component, e.g., an AC voltage component, for controlling an amplification of the spin wave. Thus, filtering behavior and inline amplification may be both controlled by the magnetoelectric cell 16. However, it should be understood that such components do not necessarily correspond to a pure AC and a pure DC component, but may involve a mutual dependence, e.g., such that both filtering and amplification may be controlled in conjunction by properties of the applied control voltage.

The tunable magnonic crystal device 10 may be adapted for filtering radio frequency (RF) signals, e.g., may form a tunable RF filter. Further, the tunable magnonic crystal device 10 may be adapted for phase shifting radio frequency signals. Further, the tunable magnonic crystal device 10 may be adapted for forming a delay line for radio frequency signals.

Figure 2:
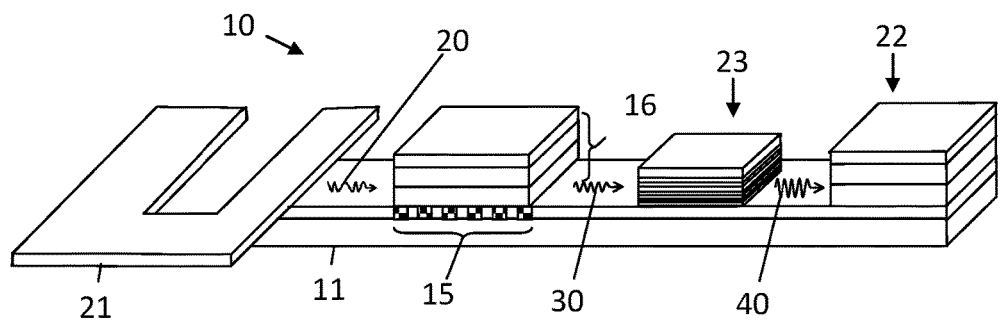
FIG. 2 illustrates another tunable magnonic crystal device, according to an example embodiment.

The tunable magnonic crystal device 10 may also comprise an input transducer 21 for converting an input signal into the spin wave 20 having the same or substantially the same spectrum as the input signal, as illustrated in FIG. 2. The input signal may, for example, be an electric or electromagnetic signal. The input transducer 21 may further comprise an impedance matching element for matching the input impedance of the transducer 21 to a circuit providing this input, e.g., a 50 Ohm impedance.

The tunable magnonic crystal device 10 may also comprise an output transducer 22 for converting the amplified filtered spin wave 40 into an output signal having the same or substantially the same spectrum as the filtered spin wave. The output signal may, for example, be an electric or electromagnetic signal.

The input transducer 21 and/or the output transducer 22 may comprise a microwave waveguide, e.g., a strip line and/or a coplanar waveguide, e.g., forming an antenna-like structure. For example, FIG. 2 shows an exemplary input transducer 21 comprising such a coplanar waveguide. Such a microwave waveguide may comprise an electrode forming a microwave antenna structure overlaying an input segment of the spin wave waveguide 11.

The input transducer 21 may comprise a magneto-electric input transducer, and likewise, the output transducer 22 may comprise a magneto-electric output transducer. For example, the magneto-electric output transducer may form the example output transducer 22 shown in FIG. 2. However, note that input and output transducers in embodiments in accordance with the present disclosure should not be interpreted as limited by the combination shown in FIG. 2.

Such magneto-electric input or output transducers may comprise a non-resonant magneto-electric transducer, or may comprise a resonant magneto-electric transducer, for example as described hereinabove, with respect to resonant and non-resonant embodiments of the magneto-electric cell 16. Thus, in examples of such resonant transducers, e.g., having a low quality factor, a pre-filtering of the signal may be obtained efficiently by the signal conversion process.

For example, a magneto-electric input/output transducer in accordance with embodiments of the present disclosure may have a similar or equal width and a length, e.g., in a plane parallel to the substrate 12, for example substantially corresponding to the width of the spin wave waveguide 11.

The input transducer 21 and/or the output transducer 22 may comprise a magnetoacoustic resonator. The input transducer 21 and/or the output transducer 22 may comprise a magnetic spin-valve. The input transducer 21 may also comprise a structure for generating a spin transfer torque or spin orbit torque on the spin wave waveguide, or the output transducer 22 may use spin transfer torque or spin orbit torque to convert the filtered spin wave to an output signal. For example, the input transducer 21 and/or the output transducer 22 may comprise a magnetic tunnel junction, or a heavy metal current conductor, such as platinum, e.g., adjacent to the spin wave waveguide 11 to form a heterostructure with the magnetic material of the waveguide 11, or a topological insulator adjacent to the waveguide 11, e.g., $Sb_2Te_3$, $Bi_2Te_3$ or $Bi_2Se_3$.

The tunable magnonic crystal device 10 may also comprise a spin wave amplifier 23 integrated in or on the spin wave waveguide 11. For example, this spin wave amplifier 23 may be adapted for amplifying the filtered spin wave 30 to form an amplified filtered spin wave 40. The spin wave amplifier 23 may, for example, comprise a further magnetoelectric cell and/or a structure for generating a spin transfer torque or spin orbit torque on the spin wave waveguide 11. For example, spin transfer torque may be generated by a magnetic tunnel junction, e.g., as illustrated in FIG. 2, and/or spin orbit torque may be generated in accordance with a spin-Hall geometry, e.g., by passing a current through a heavy metal, such as platinum, adjacent to the waveguide 11, or through a topological insulator adjacent to the waveguide, e.g., $Sb_2Te_3$, $Bi_2Te_3$ or $Bi_2Se_3$.

In some embodiments, amplification can thus be integrated in the spin wave domain, e.g., to compensate for signal intensity losses before conversion by the output transducer 22. Thus, transmission losses incurred by transmission through the waveguide 11 and filtering by the magnonic crystal structure 15 can be compensated before further losses are accumulated by signal conversion.

However, a tunable magnonic crystal device in accordance with embodiments of the present disclosure may also comprise, additionally or alternatively, an electrical signal amplifier connected to the output transducer 22 for amplifying the output signal in the electrical domain. For example, such an electrical signal amplifier may comprise a sense amplifier or a transistor. Further, the spin wave amplifier 23 and an electrical signal amplifier connected to the output transducer 22 may be combined. For example, while the spin wave amplifier 23 may prevent a further signal degradation before conversion to the electrical domain, the electrical signal amplifier, e.g., a sense amplifier, may condition the output signal to a suitable signal amplitude for further processing in a CMOS compatible integrated circuit.

For example, the electrical signal amplifier may comprise a sense amplifier integrated in the substrate 12, e.g., in a silicon substrate on which the spin wave waveguide 11 is provided. For example, such a sense amplifier may be integrated in the substrate 12 underneath the spin wave waveguide 11 and/or the magnonic crystal structure 15. Alternatively, such an electrical signal amplifier may be integrated in a back-end-of-line process near, e.g., adjacent to, the output transducer 22. For example, using a deposited channel material, e.g., a transition metal chalcogenide such as $MoS_2$.

In a second aspect, embodiments of the present disclosure relate to a method for selectively filtering a spectral component of a signal. This method may comprise providing the signal in the form of a spin wave. Providing the signal may comprise receiving a radio frequency electric or electromagnetic input signal, and converting this input signal into the spin wave, e.g., such that the spin wave has substantially the same spectrum as the input signal.

The method may further comprise applying a control voltage to a magneto-electric cell operably connected to a magnonic crystal structure, to select a spectral parameter of the spectral component of the spin wave based on an interaction, dependent on the control voltage, between the magneto-electric cell and a magnetic property of the magnonic crystal structure, e.g., a magnetocrystalline anisotropy.

The method may further comprise converting the filtered spin wave into an electric or electromagnetic output signal, such that the output signal has substantially the same spectrum as the filtered spin wave.

Further, in some embodiments of the present disclosure, the method may comprise amplifying the filtered spin wave before converting the filtered spin wave into the output signal.

In some embodiments of the present disclosure, the method may be performed by operating a device in accordance with embodiments of the first aspect of the present disclosure. Features of a method in accordance with embodiments of the present disclosure shall therefore be clear from the description provided hereinabove in relation to such a device.

Figure 6:
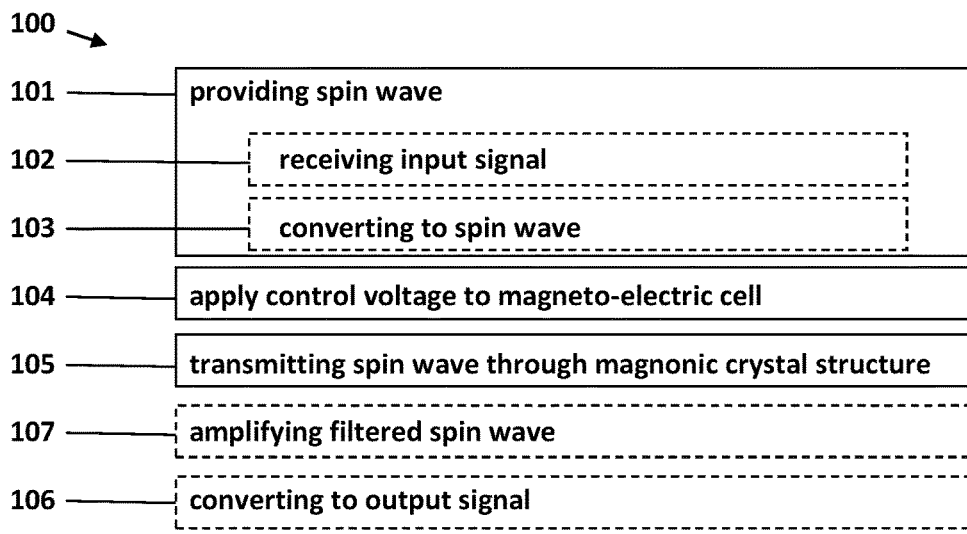
FIG. 6 illustrates a method for selective filtering of a spectral component of a signal, according to an example embodiment.

Referring to FIG. 6, an example method 100 in accordance with embodiments of the present disclosure is shown. This method 100 provides selective filtering of a spectral component of a signal.

At block 101, the method 100 comprises providing the signal in the form of a spin wave. As shown at blocks 102 and 103, providing the signal may comprise receiving a radio frequency electric or electromagnetic input signal, and converting this input signal into the spin wave, e.g., such that the spin wave has substantially the same spectrum as the input signal.

At block 104, the method further comprises applying a control voltage to a magneto-electric cell operably connected to a magnonic crystal structure, so as to select a spectral parameter of the spectral component of the spin wave based on an interaction, dependent on the control voltage, between the magneto-electric cell and a magnetic property of the magnonic crystal structure, e.g., a magnetocrystalline anisotropy. Thus, by applying the control voltage to the magneto-electric cell, a magnetic property of the magnonic crystal structure may be influenced, e.g., changed.

This magnetic property may be affected, e.g., influenced or determined, by a magnetization of a magnetostrictive material of the magneto-electric cell. This magnetization of the magnetostrictive material may further be affected, e.g., determined, by a piezoelectrically generated mechanical stress in the magneto-electric cell that is induced by the control voltage.

At block 105, the method further comprises transmitting the spin wave through the magnonic crystal structure to generate a filtered spin wave by selectively filtering the spin wave spectral component of the spin wave in accordance with the selected spectral parameter.

At block 106, the method may further comprise converting the filtered spin wave into an electric or electromagnetic output signal, such that the output signal has substantially the same spectrum as the filtered spin wave.

Further, a method in accordance with embodiments of the present disclosure may comprise, at block 107, a step of amplifying the filtered spin wave before converting the filtered spin wave into the output signal.

In a further aspect, embodiments of the present disclosure may relate to a radio frequency signal filter comprising a tunable magnonic crystal device in accordance with embodiments of the present disclosure. Likewise, embodiments of the present disclosure may also relate to the use of a device in accordance with embodiments of the first aspect of the present disclosure for filtering a radio frequency signal.

In a yet further aspect, embodiments of the present disclosure may relate to a radio frequency signal phase shifter comprising a tunable magnonic crystal device in accordance with embodiments of the present disclosure. Likewise, embodiments of the present disclosure may also relate to the use of a device in accordance with embodiments of the first aspect of the present disclosure for phase shifting a radio frequency signal.

In a further aspect, embodiments of the present disclosure may relate to a radio frequency signal delay line comprising a tunable magnonic crystal device in accordance with embodiments of the present disclosure. Likewise, embodiments of the present disclosure may also relate to the use of a device in accordance with embodiments of the first aspect of the present disclosure for delaying a radio frequency signal.

What is claimed is:

1. A tunable magnonic crystal device, comprising:
   a spin wave waveguide;
   a magnonic crystal structure provided in or on the spin wave waveguide, the magnonic crystal structure being adapted for selectively filtering a spin wave spectral component of a spin wave propagating through the spin wave waveguide so as to provide a filtered spin wave; and
   a magneto-electric cell operably connected to the magnonic crystal structure, wherein the magneto-electric cell comprises an electrode for receiving a control voltage, and wherein adjusting the control voltage of the electrode controls a spectral parameter of the filtered spectral component of the spin wave via an interaction, dependent on the control voltage, between the magneto-electric cell and a magnetic property of the magnonic crystal structure.

2. The tunable magnonic crystal device of claim 1, wherein the magneto-electric cell comprises a magnetostrictive layer and a piezoelectric layer, wherein adjusting the control voltage of the electrode adjusts an electric field in the piezoelectric layer thereby inducing a mechanical stress in the magnetostrictive layer, and wherein the induced mechanical stress in the magnetostrictive layer adjusts a magnetization of the magnetostrictive layer thereby adjusting the magnetic property of the magnonic crystal structure.

3. The tunable magnonic crystal device of claim 1, wherein the spin wave waveguide comprises an elongate ferromagnetic or ferrite material on a substrate.

4. The tunable magnonic crystal device of claim 1, wherein the spin wave waveguide is adapted for conducting the spin wave, and wherein the spin wave comprises at least a microwave frequency spectral component.

5. The tunable magnonic crystal device of claim 1, wherein the magnonic crystal structure comprises a periodic structure formed by a periodic spatial variation of magnetic or geometrical properties.

6. The tunable magnonic crystal device of claim 5, wherein the periodic spatial variation comprises a periodic variation of at least one of a saturation magnetization, a damping, a magnetocrystalline anisotropy, or a shape of the magnonic crystal structure.

7. The tunable magnonic crystal device of claim 1, further comprising:
an input transducer for converting an input signal into the spin wave, wherein the spin wave has substantially the same spectrum as the input signal; and
an output transducer for converting the filtered spin wave into an output signal having substantially the same spectrum as the filtered spin wave.

8. The tunable magnonic crystal device of claim 7, wherein at least one of the input transducer or the output transducer comprises a magneto-electric transducer or a co-planar waveguide antenna.

9. The tunable magnonic crystal device of claim 1, further comprising a spin wave amplifier in or on the spin wave waveguide for amplifying the filtered spin wave.

10. The tunable magnonic crystal device of claim 9, wherein the spin wave amplifier is configured to generate a spin transfer torque or a spin orbit torque on the spin wave waveguide.

11. The tunable magnonic crystal device of claim 10, wherein the spin wave amplifier comprises a magnetic tunnel junction, and wherein the magnetic tunnel junction generates the spin transfer torque on the spin wave waveguide.

12. The tunable magnonic crystal device of claim 1, further comprising:
an output transducer for converting the filtered spin wave into an output signal having substantially the same spectrum as the filtered spin wave; and
an electrical signal amplifier connected to the output transducer for amplifying the output signal in the electrical domain.

13. The tunable magnonic crystal device of claim 12, further comprising a semiconductor substrate underneath at least one of the spin wave waveguide or the magnonic crystal structure, wherein the electrical signal amplifier comprises a sense amplifier integrated in the semiconductor substrate.

14. A method for selectively filtering a spectral component of a signal, the method comprising:
providing the signal in the form of a spin wave;
transmitting the spin wave through a magnonic crystal structure, thereby filtering a spin wave spectral component of the spin wave so as to provide a filtered spin wave; and applying a control voltage to a magneto-electric cell operably connected to the magnonic crystal structure in order to control a spectral parameter of the filtered spectral component of the spin wave via an interaction, dependent on the control voltage, between the magneto-electric cell and a magnetic property of the magnonic crystal structure.

15. The method of claim 14, wherein providing the signal in the form of a spin wave comprises receiving a radio frequency electric or electromagnetic input signal and converting the received input signal into the spin wave, such that the spin wave has substantially the same spectrum as the received input signal.

16. The method of claim 14, further comprising converting the filtered spin wave into an electric or electromagnetic output signal, such that the output signal has substantially the same spectrum as the filtered spin wave.

17. The method of claim 14, wherein the magneto-electric cell comprises a magnetostrictive layer and a piezoelectric layer, and wherein applying the control voltage to the magneto-electric cell in order to control the spectral parameter of the filtered spectral component of the spin wave comprises:
applying an electric field to the piezoelectric layer thereby inducing a mechanical stress in the magnetostrictive layer, wherein the induced mechanical stress in the magnetostrictive layer adjusts a magnetization of the magnetostrictive layer thereby adjusting the magnetic property of the magnonic crystal structure in order to control the spectral parameter of the filtered spectral component of the spin wave.

18. The method of claim 14, further comprising transmitting the filtered spin wave through a spin wave amplifier in order to amplify the filtered spin wave.

19. The method of claim 14, wherein transmitting the spin wave through the magnonic crystal structure comprises transmitting the spin wave through a periodic structure formed by a periodic spatial variation of magnetic or geometrical properties.

20. The method of claim 19, wherein the periodic spatial variation comprises a periodic variation of at least one of a saturation magnetization, a damping, a magnetocrystalline anisotropy, or a shape of the magnonic crystal structure.

* * * * *